(12) United States Patent
McClanahan et al.

(10) Patent No.: US 7,495,458 B2
(45) Date of Patent: Feb. 24, 2009

(54) PROBE CARD AND TEMPERATURE STABILIZER FOR TESTING SEMICONDUCTOR DEVICES

(75) Inventors: Adolphus E. McClanahan, Garland, TX (US); John D. Wolfe, Celina, TX (US); Michael P. Harris, Garland, TX (US); Frank J. Mesa, Murphy, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/383,866

(22) Filed: May 17, 2006

(65) Prior Publication Data
US 2007/0268029 A1 Nov. 22, 2007

(51) Int. Cl.
*G01R 31/02* (2006.01)
(52) U.S. Cl. ...................................... 324/754
(58) Field of Classification Search ............. 324/754, 324/765, 761, 762, 760, 158.1, 755–758
See application file for complete search history.

(56) References Cited

U.S. PATENT DOCUMENTS

| | | | | |
|---|---|---|---|---|
| 3,963,985 A | * | 6/1976 | Geldermans | 324/754 |
| 5,124,639 A | * | 6/1992 | Carlin et al. | 324/760 |
| 5,570,032 A | * | 10/1996 | Atkins et al. | 324/760 |
| 6,545,493 B1 | * | 4/2003 | Iino | 324/754 |
| 6,586,956 B2 | * | 7/2003 | Aldaz et al. | 324/758 |
| 7,002,363 B2 | * | 2/2006 | Mathieu | 324/758 |
| 7,285,968 B2 | | 10/2007 | Eldridge et al. | |
| 7,307,433 B2 | * | 12/2007 | Miller et al. | 324/754 |

* cited by examiner

*Primary Examiner*—Ha Tran T Nguyen
*Assistant Examiner*—Tung X Nguyen
(74) *Attorney, Agent, or Firm*—Yingsheng Tung; Wade J. Brady, III; Frederick J. Telecky, Jr.

(57) ABSTRACT

One aspect of the invention provides an apparatus that includes a probe card having probe needles associated therewith. A temperature stabilizer element is couplable to the probe card. The temperature stabilizer is configured to either raise or lower a temperature of the probe needles to reduce movement of the probe needles.

12 Claims, 3 Drawing Sheets

PROBE CARD AND TEMPERATURE STABILIZER FOR TESTING SEMICONDUCTOR DEVICES

TECHNICAL FIELD OF THE INVENTION

The invention is directed in general to a device for testing semiconductor devices and, more specifically, to a probe card and temperature stabilizer for testing semiconductor devices.

BACKGROUND OF THE INVENTION

The pursuit of ensuring high quality product yield within the semiconductor manufacturing industry is an ongoing endeavor. To that end, the industry expends significant amounts of time and money to methodically test as many completed semiconductor devices as possible to ensure consistent operability. One way in which they accomplish these tests is by the use of a wafer probing apparatus. These wafer probes typically include a prober/tester that is used in conjunction with a separate probe card. The probe card, which is a printed circuit board (PCB), has contact pads on a surface that are engaged by pogo pins of the tester. The probe card includes a ring assembly and probing needles that engage contact pads on a semiconductor chip that is to be tested. The probing needles are mechanically connected to the contact pads. Thus, when the pogo pins engage the contact pads of the probe card, electrical current can be applied to different contact pads of the semiconductor chip to test different areas of the chip to ensure its full operability.

Wafer probe apparatuses do have problems associated with their use. One problematic area involves the very thin probe needles that engage the contact pads of the semiconductor chip. Due to the fact that they are extremely thin (about 76.2 microns or less), they are highly susceptible to alignment issues between the probe card and wafer probe pads associated with high temperature wafer testing. If the needle changes too much in response to a temperature change, it can become misaligned. This can have serious repercussions on the accuracy of the readings, or it can cause the needle to over scrub the semiconductor chip, which can result in irreparable damage to the chip.

Temperature variations can also be introduced during the testing process or when the needle is cleaned during the operation of probing of the semiconductor chips. In such instances, misalignment may occur. To compensate for this, additional testing time must be taken to allow the needle to re-adjust to the temperature change. Sometimes the needle properly re-aligns, and sometimes it does not. This adds additional time to an already lengthy testing process, which further decreases product output productivity. Moreover, any chips that are damaged due to over scrubbing by the probe needles have to be discarded, thereby decreasing product yields as well.

Accordingly, what is needed is an apparatus and method of testing semiconductor devices that avoids the disadvantages associated with the above-described testing devices.

SUMMARY OF THE INVENTION

The invention, in one embodiment, provides a semiconductor testing apparatus. In this embodiment, the apparatus comprises a probe card having probe needles associated therewith. A temperature stabilizer element is couplable to the probe card. The temperature stabilizer is configured to either raise or lower a temperature of the probe needles to reduce their movement.

In yet another embodiment, the invention provides a system for testing a semiconductor device. In this embodiment, the system comprises a prober configured to receive a probe card therein. The probe card is configured to be received in the prober and includes a plurality of contact pads located on a surface thereof. The probe card further includes probe needles that are located under the surface on which the contact pads are located. A temperature stabilizer element is coupled to the probe card and is configured to either raise or lower a temperature of the probe needles. The system further comprises a tester comprising a testing head that has probes located on it and each of the probes is orientable to engage a different contact pad of the probe card and a control module that is electrically coupled to the testing head that controls an operation of the probes.

In yet another embodiment, the invention provides a method of fabricating a semiconductor device. The method comprises providing an integrated circuit (IC) and testing the IC. The testing step, in one embodiment, comprises placing the IC in a prober, placing a probe card in the prober. The probe card has a plurality of contact pads located on its surface that are electrically connected to corresponding probe needles located under the probe card. The probe needles are brought into contact with contact pads located on the IC. A tester is positioned over the probe card and includes a testing head having probes located thereon. The probes are positioned onto different contact pads of the probe card and a control module that is electrically coupled to the testing head to test the IC is used to control the testing process. The method of testing further includes adjusting a temperature of the probe needles to reduce movement of the probe needles by applying a voltage to a temperature stabilizer element that is coupled to the probe card. The temperature stabilizer element is configured to provide either heat or cold to the probe card upon a change in the polarity of the applied voltage.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
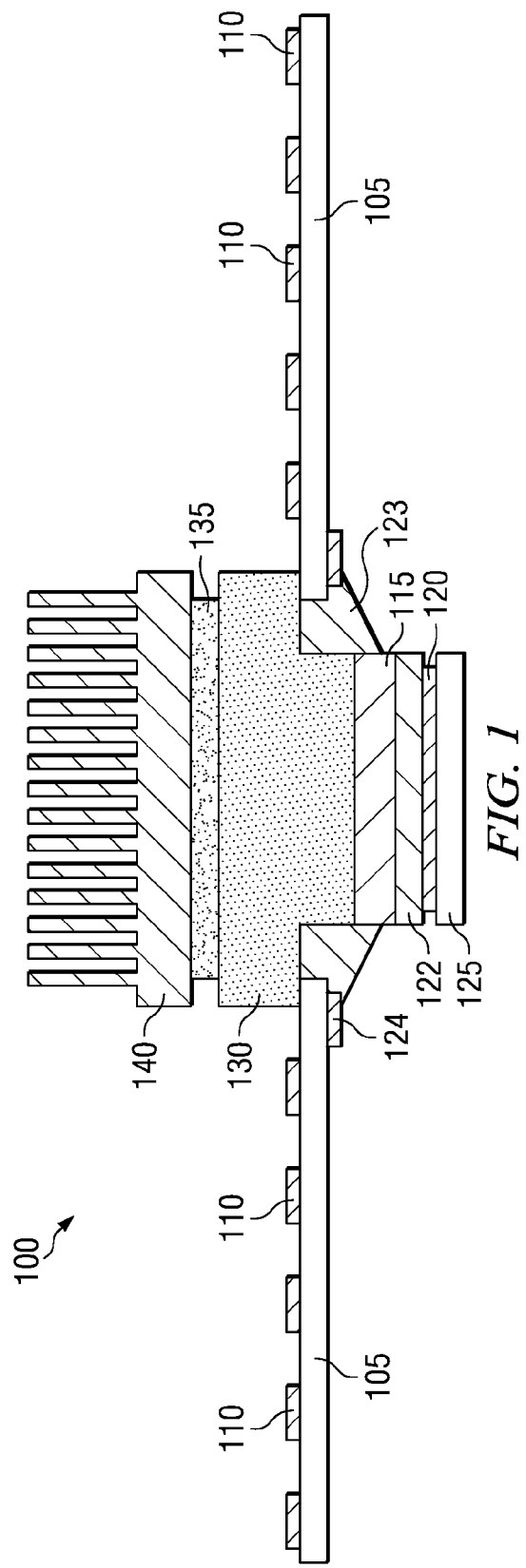
FIG. 1 illustrates a semiconductor device testing apparatus by the invention.

FIG. 1 illustrates one embodiment of a semiconductor testing apparatus 100 of the invention. This embodiment includes a probe card 105. The probe card 105 may be of conventional design. In such embodiments, the probe card 105 will include multiple levels of circuits traces located between multiple layers of the probe card 105. It will also have a plurality of contact pads 110 located on its surface. The probe card 105 further includes a ceramic ring 115. Probe needles 120 are located underneath the probe card 105 and are supported by the ceramic ring 115 and attached to the ceramic ring 115 with an epoxy 122, as shown. Various probe needle extensions 123 extend through the ceramic ring 115 and connect to individual probe needles 120. The probe needle extensions 123 are connected to the probe card 105 at a solder point 124. A conductive trace, which is not shown, extends from each of the solder points 124 to the individual contact pads, thereby providing electrical connection of the probe needles 120 to the different contact pads 110. During a testing procedure, the probe needles 120 are brought into contact with an IC 125, which in this embodiment, does not form a part of the semiconductor testing apparatus 100.

In one embodiment, the semiconductor testing apparatus 100 may include a stiffener 130 that is couplable to the probe card 105. When present, the stiffener 130 is used to minimize flex in the probe card 105, and it may be of conventional design.

The apparatus 100 further includes a temperature stabilizing element 135 that is thermally coupled to the probe needles 120. In the illustrated embodiment, the temperature stabilizing element 135 is coupled to the stiffener 130, which in turn is thermally coupled to the probe needles 120 by way of the ceramic ring 115. However, in another embodiment, the temperature stabilizing element 135 may have sufficient stiffness such that the stiffener 130 is not needed. In such instances, the temperature stabilizing element 135 may be coupled directly to the probe card 105. Thus, the temperature stabilizer 135 is thermally coupled to the probe needles 120, such that a change of temperature in the temperature stabilizer 135 is applied to and effects a temperature change of the probe needles 120. However, in those embodiments where the stiffener 130 is present, the temperature stabilizing element 135 is couplable to the stiffener 130. In and alternative embodiment, the temperature stabilizing element 135 and the stiffener 130 may form a single unit. The temperature stabilizing element 135 is configured to either raise or lower a temperature of the probe needles 120 to reduce their movement. These aspects of the invention are discussed below in more detail.

In one embodiment, the apparatus 100 may also include a heat sink 140. When present, the heat sink may be couplable to the temperature stabilizing element 135. The heat sink 140 draws heat from the temperature stabilizing element 135 and increases its cooling efficiency. In other embodiments, however, the heat sink may be integrally formed with the temperature stabilizing element 135.

Figure 2:
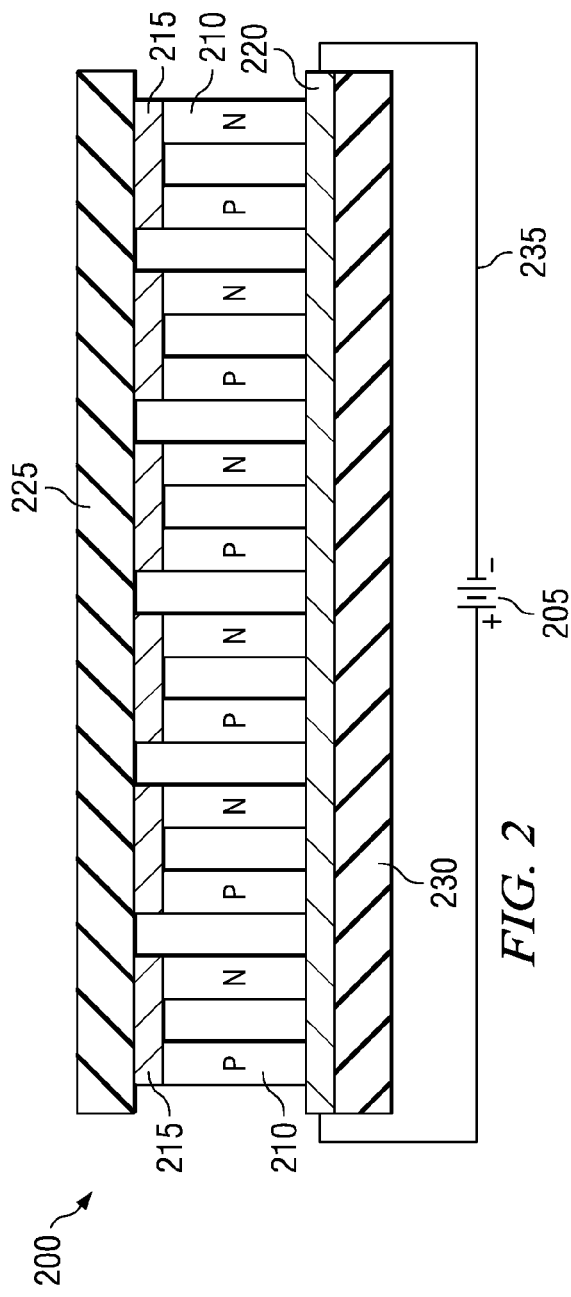
FIG. 2 illustrates an embodiment of a temperature stabilizing element of the invention.

FIG. 2 illustrates one embodiment of a temperature stabilizing element 200 of the invention. In the illustrated embodiment, the temperature stabilizing element 200 is comprised of a series of P doped and N doped nodes 210. One end of the nodes 210 is electrically coupled in series by a segmented conductive layer 215, while their opposing ends are electrically coupled by an un-segmented conductive layer 220, which is electrically connected to the direct current source 205 by conductive wires 235. The nodes 210 may be an appropriately doped bismuth-telluride semiconductor material. The nodes 210 are located between opposing ceramic plates 225 and 230. The ceramic plates 225 and 230 add rigidity and the necessary electrical insulation. The temperature stabilizing element 200 of this embodiment is based on the Peltier Effect where DC applied across two dissimilar materials causes a temperature differential. As the electrons move from the P type material to the N type material through an electrical connector, the electrons jump to a higher energy state absorbing thermal energy (cold side). Continuing through the lattice of material, the electrons flow from the N type material to the P type material through an electrical connector, dropping to a lower energy state and releasing energy as heat to the heat sink (hot side). Thermoelectric devices, such as the one illustrated in FIG. 2 can, therefore, be used to heat and to cool, depending on the direction of the current. The element illustrated in FIG. 2 may be a Peltier diode, which is commercially available.

In another embodiment, the temperature stabilizing element 200 may be a thermoelectric element. For example, the thermoelectric element may be a heater/cooling fan combination. In such embodiments, the heat sink may not be necessary or it may be integrally formed with or coupled to the heater/cooling fan. In another embodiment, however, the thermoelectric element is configured to provide either heat or cold to a probe card, depending on the direction (or polarity) of a current supplied by a direct current source (DC) 205.

The ability to control the amount of heat or cold applied to the probe needles 120 allows for better control over their movement. A desired temperature range that reduces the movement of the probe needles 120 can be targeted and the temperature stabilizing element can then be used to keep the probe needles 120, within that temperature range. This, in turn, would reduce the amount of movement of the probe needles 120 caused by large temperature fluctuations and reduce the amount of probe needle 120 misalignment and over-scrubbing.

Figure 3:
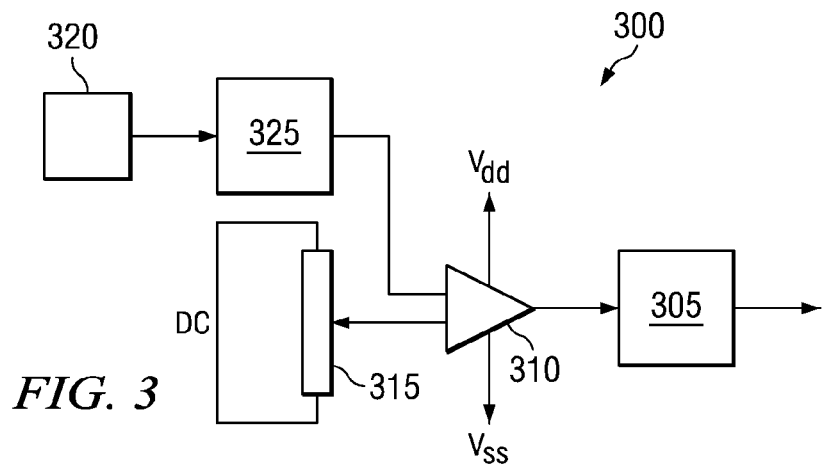
FIG. 3 illustrates an embodiment of a controller that can be used in the invention.

The testing apparatus of the invention, in another embodiment, may also include a controller 300, as illustrated in FIG. 3, with continued reference to FIG. 1. The controller 300 can be used to control the temperature stabilizer element 305 and keep the probe needles 120 within the targeted temperature range. In one embodiment, the controller 300 comprises a comparator/driver 310 that is connected to DC power supply Vss and Vdd, as indicated. A temperature set element 315 is electrically coupled to the comparator/driver 310 and to a DC source, as indicated. It is configured to provide a desired temperature range at which the probe needles 120 are to be maintained. In effect, it functions as a temperature governor by providing a defined temperature range of operation for the probe needles 120. The temperature set element 315 may be a variable resistor, a potentiometer, or similar device. The comparator/driver 310 is also electrically coupled to a thermocouple 320. The thermocouple 320 provides an operating temperature of the ceramic ring 115 to the comparator/drive 310. In one embodiment, it may be necessary to scale the voltage used to operate the thermocouple 320 up or down. In such embodiments, the controller 300 may also include a voltage scaling unit 325 that is coupled to the comparator/driver 310.

In operation, a temperature of a ceramic ring 115 to which the probe needles 120 are attached is read by the thermocouple 320. As mentioned in certain embodiments, the thermocouple 320 may operate on a millivolt range. In such instances, the voltage scaling unit 325 will scale the voltage up such that the comparator/driver 310 may be able to read the signal. The comparator/driver 310 will compare the temperature of the ceramic ring 115 provided by the thermocouple 320 to the set temperature provided by the temperature set element 315. If the temperature is outside the set temperature, the comparator/driver 310 will adjust the voltage applied to the temperature stabilizer element 305 to cause it to either provide heat or cold to the probe needles 120 to bring their temperature into the set range.

Figure 4:
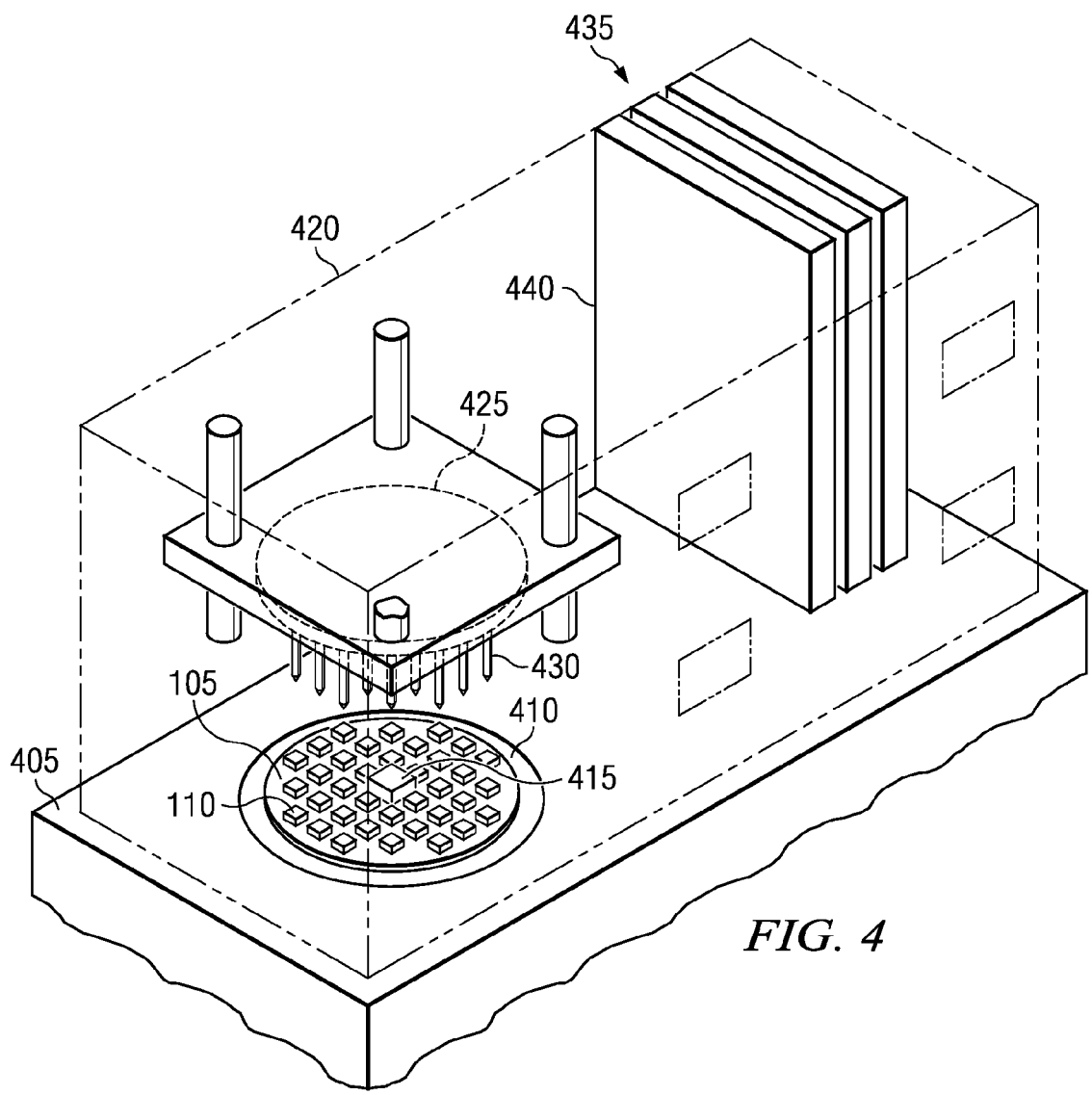
FIG. 4 illustrates a prober and tester system in which the testing apparatus may be employed to test a semiconductor device.

FIG. 4 illustrates a system for testing a semiconductor device. In one embodiment, the system comprises a prober 405 that includes a probe card pan 410 and which may be of conventional design. The pan 410 is configured to receive the probe card 105 of FIG. 1. The probe card 105 includes the plurality of contact pads 110 and the probe needles, which cannot be seen in this view. The stiffener 130, temperature stabilizer element 135 and heat sink 140 of FIG. 1 are schematically shown as a single module 415. The system 400 of the invention further includes a tester 420 that comprises a testing head 425 that has probes 430 located thereon wherein each of the probes 430 can be oriented to engage a different contact pad 110 of the probe card 105. The testing head 425 is mechanically lowered such that each of the probes 430 contacts the correct contact pad 110.

In the illustrated embodiment, the tester 420 also comprises a control module 435 that is electrically coupled to the testing head 425 and controls the testing operation of the semiconductor device. The control module 435 may be comprised of a number of IC boards 440 and may include the controller 300 of FIG. 3. It should be noted that both the prober 405 and tester 420 may be of conventional design and are commercially available from a number of suppliers.

Figure 5:
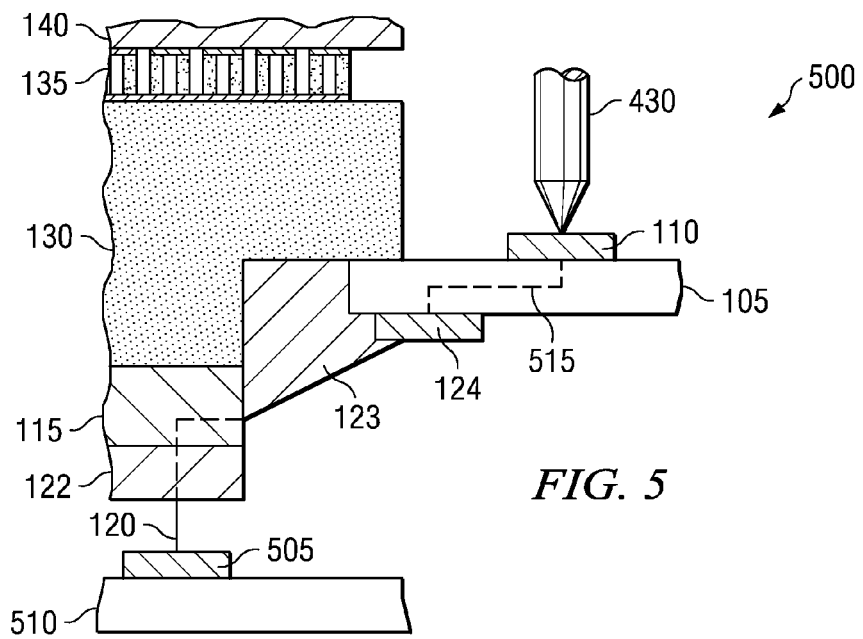
FIG. 5 illustrates the implementation of the testing apparatus with a semiconductor device.

FIG. 5 illustrates an enlarged view of a testing apparatus 500 provided by the invention. In this embodiment, the testing apparatus 500 is engaged with a contact pad 505 of a semiconductor device 510. In this embodiment, the test apparatus 500 includes the probe card 105, the stiffener 130, the temperature stabilizing element 135, and the heat sink 140 of FIG. 1. FIG. 5 further illustrates in a general way, how the probe 430 of the tester 420 (FIG. 4) makes electrical contact with the contact pad 110. A conductive trace 515 located within the probe card 105 provides a conductive path from the contact pad 110 to the solder point 124. The probe needle extension extends from the solder point 124 and makes electrical connection with the probe needle 120 by way of a conductive trace 520 that extends through the ceramic ring 115 and epoxy 122. The probe needle 120 contacts the contact pad 505, as shown. Thus, electrical connection is made between the probe 430 and the semiconductor device 510.

During placement of the probe needle 120 on the contact pad 505, the contact pad 505 is "scrubbed" by the probe needle 120 to remove a protective oxide coating on the contact pad 505. This is done to insure good electrical contact between the probe needle 120 and the contact pad 505. If the temperature of probe card 105, and thus the probe needle 120, has fluctuated enough to cause misalignment of the probe needle 120, the probe needle 120 may over scrub or miss the contact pad 505 altogether. In either case, the over scrubbing can irreparably damage the semiconductor device 510. However, with the invention the potential for any damage is reduced because the temperature stabilizing element 135 can be used to maintain a temperature of the probe needle 120 within a set range, which reduces the amount of movement and misalignment of the probe needle 120.

Figure 6:
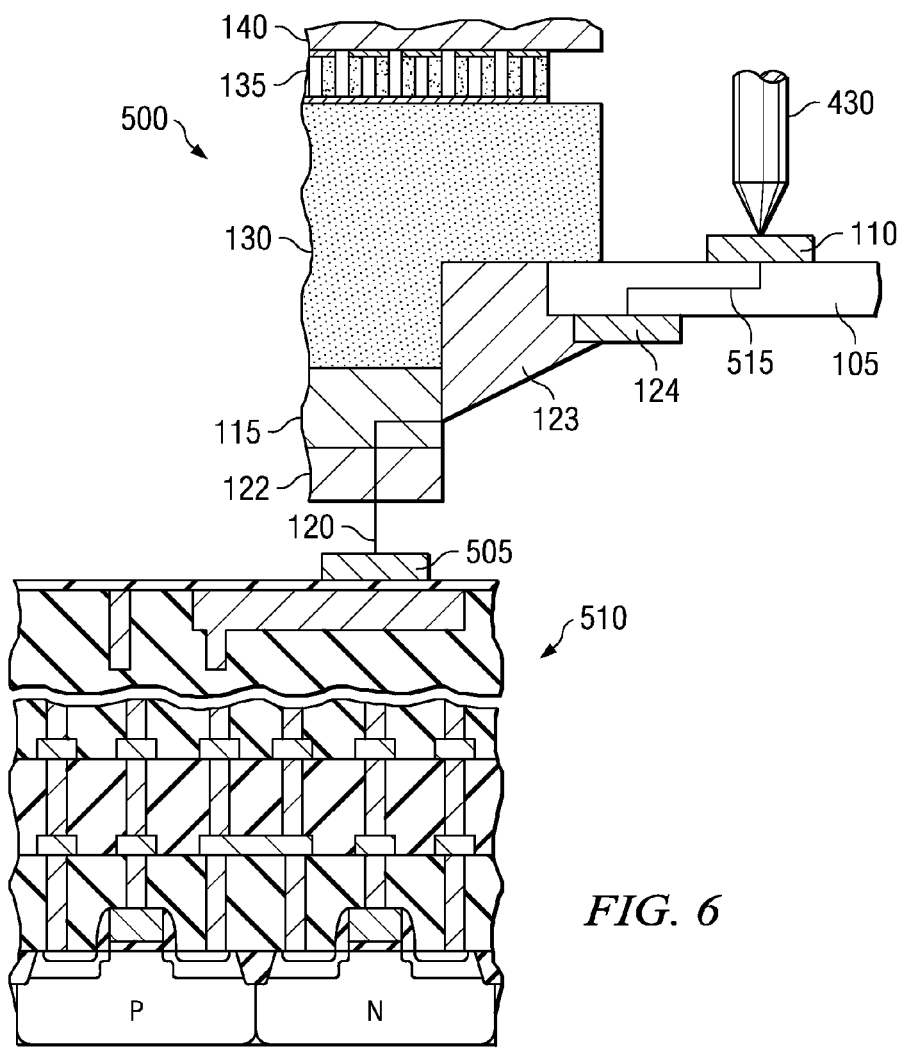
FIG. 6 illustrates the implementation of the testing apparatus with an IC.

FIG. 6 schematically illustrates a method of testing an IC (e.g., semiconductor device 510, FIG. 5) that is located on a wafer. Since the components are the same as those discussed in FIG. 5, the same reference will be used. The IC 510 is provided, and it and the probe card 105 are positioned within the prober 405 (FIG. 4), as discussed above. The probe needles 120 are brought into contact with the pads 505 located on the IC 510 and the prober 430 is then brought into contact with contact pad 110 located on the probe card 105. Using the prober 405 and tester 420 (FIG. 4), the testing may then be conducted in a way known to those who are skilled in the art. During the testing of the IC 510 or cleaning the probe needles 120, the temperature of the probe card 105 may be adjusted in the manner described above to reduce movement of the probe needles 120 by applying a voltage to the temperature stabilizer element 135 to provide either heat or cold to the probe needles 120, depending on the direction of the current.

Those skilled in the art to which the invention relates will appreciate that other and further additions, deletions, substitutions and modifications may be made to the described embodiments without departing from the scope of the invention.

What is claimed is:

1. A semiconductor testing apparatus, comprising:
    a probe card having probe needles associated therewith; and
    a temperature stabilizer element coupled to a direct current source, including a series of P doped and N doped bismuth-telluride semiconductor material located between opposing ceramic plates, coupled to the probe card and operable to raise and lower temperature of the probe needles to thereby reduce movement of the probe needles; wherein a change in an applied current direction causes the temperature stabilizer element to provide either heat or cold to the probe card.

2. The apparatus recited in claim 1, further comprising a controller electrically coupled to the temperature stabilizing element, the controller controlling whether temperature stabilizing element provides heat or cold to the probe needles.

3. The apparatus recited in claim 2, wherein the controller comprises a comparator/driver, a temperature set element coupled to the comparator/driver and configured to provide a desired temperature range at which the probe needles are to be maintained and, a voltage scaling unit coupled to the comparator/driver, and a thermocouple coupled to the voltage scaling unit and configured to read a temperature of the probe needles.

4. The apparatus recited in claim 1, further comprising a stiffener couplable to the probe card.

5. The apparatus recited in claim 1, further comprising a heat sink couplable to the temperature stabilizer element.

6. The apparatus recited in claim 1, wherein a heat sink and a stiffener are integrally formed with the temperature stabilizer element.

7. The apparatus recited in claim 1, further comprising a stiffener integrally formed with the temperature stabilizer element.

8. A method of testing a semiconductor device, comprising:
    providing an integrated circuit (IC); and
    testing the IC, comprising:
        placing the IC in a prober;
        placing a probe card in the prober, the probe card having a plurality of contact pads located on a surface thereof that are electrically connected to corresponding probe needles located under the probe card;
        bringing the probe needles into contact pads located on the IC;
        positioning a tester over the probe card, the tester including a testing head having probes located thereon;
        positioning each of the probes onto a different contact pad of the probe card; and
        using a control module electrically coupled to the testing head to test the IC;
        raising temperature of the probe needles by applying a current in a first direction to a temperature stabilizer element that is coupled to the probe card; and
        lowering temperature of the probe needles by applying a current in a direction opposite the first direction to the temperature stabilizer element that is coupled to the probe card.

9. The method recited in claim 8, wherein the temperature stabilizer element is a thermoelectric element and adjusting the temperature includes reversing the polarity of the applied voltage.

10. The method recited in claim 9, wherein the thermoelectric element comprises a series of P doped and N doped bismuth-telluride semiconductor material located between opposing ceramic plates.

11. The method recited in claim 8, further controlling an operation of the temperature stabilizing element by using a controller electrically coupled to the temperature stabilizing element, to cause the temperature stabilizing element to provide heat or cold to the probe needles.

12. The method recited in claim 11, wherein controlling includes using a comparator/driver to adjust a voltage applied to the temperature stabilizer when a read temperature of the probe card provided to the comparator/driver by the thermocouple is outside of a set temperature range for the probe needles provided to the comparator/driver by the temperature set element.

* * * * *